US012253199B2

United States Patent
Gong et al.

(10) Patent No.: US 12,253,199 B2
(45) Date of Patent: Mar. 18, 2025

(54) JOINT, COOLING SYSTEM, AND COMPUTER APPARATUS

(71) Applicant: Huawei Technologies Co., Ltd., Shenzhen (CN)

(72) Inventors: Xinhu Gong, Shenzhen (CN); Haofeng Chen, Dongguan (CN); Gaoliang Xia, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 388 days.

(21) Appl. No.: 17/576,284

(22) Filed: Jan. 14, 2022

(65) Prior Publication Data

US 2022/0136634 A1 May 5, 2022

Related U.S. Application Data

(63) Continuation of application No. PCT/CN2020/102223, filed on Jul. 15, 2020.

(30) Foreign Application Priority Data

Jul. 17, 2019 (CN) .......................... 201910646039.3

(51) Int. Cl.
*F16L 37/35* (2006.01)
*H05K 7/20* (2006.01)

(52) U.S. Cl.
CPC .......... *F16L 37/35* (2013.01); *H05K 7/20327* (2013.01); *H05K 7/20818* (2013.01); *H05K 7/20309* (2013.01); *H05K 7/20318* (2013.01)

(58) Field of Classification Search
CPC . F16L 37/35; F16L 37/34; F16L 37/32; F16L 37/413; F16L 37/42; F16L 37/26;
(Continued)

(56) References Cited

U.S. PATENT DOCUMENTS 2,304,390 A * 12/1942 Wolfram .................. F16L 29/04
137/614.03
2,449,938 A * 9/1948 Hansen .................... F16L 29/04
137/614.03

(Continued)

FOREIGN PATENT DOCUMENTS

CN 201206687 Y 3/2009
CN 101861086 A 10/2010
(Continued)

OTHER PUBLICATIONS

Shanghai Institute of Navigation, "Mainstream Ship Model Service Manual," Jan. 1, 2013, with an English summary, 3 pages.

*Primary Examiner* — Craig J Price
(74) *Attorney, Agent, or Firm* — Conley Rose, P.C.

(57) ABSTRACT

A joint includes a male module and a female module capable of docking with each other. The male module includes a core rod and a sliding cylinder that is slidably sleeved on an outer periphery of the core rod. A first valve port is disposed in the sliding cylinder, and the core rod is provided with a piston head that is in hermetic fit with the first valve port. The female module includes a valve body and a piston. A first channel is disposed in the valve body, the piston is slidably disposed in the first channel, and a second valve port that is in hermetic fit with the piston is disposed in the first channel.

20 Claims, 10 Drawing Sheets

(58) Field of Classification Search
CPC . F16L 29/04; Y10T 137/87941–87965; H05K 7/20327; H05K 7/20818; H05K 7/20309; H05K 7/20318
USPC .................................. 137/614–614.5, 798
See application file for complete search history.

(56) References Cited

U.S. PATENT DOCUMENTS

| | | | | |
|---|---|---|---|---|
| 2,451,441 | A * | 10/1948 | Main, Jr. | F16L 29/04 137/614.04 |
| 2,457,251 | A * | 12/1948 | Main, Jr. | F16L 37/34 137/614.04 |
| 2,461,700 | A * | 2/1949 | Scheiwer | F16L 37/34 137/614.03 |
| 2,505,093 | A * | 4/1950 | Hudson | F16L 29/04 137/614.04 |
| 2,545,796 | A * | 3/1951 | Scheiwer | F16L 37/23 137/614.04 |
| 2,568,516 | A * | 9/1951 | Scheiwer | F16L 37/413 251/149.6 |
| 2,753,195 | A * | 7/1956 | Palmer | F16L 37/088 285/276 |
| 3,213,884 | A * | 10/1965 | Moyer | F16L 37/23 137/625.48 |
| 3,809,122 | A | 5/1974 | Berg | |
| 3,866,638 | A * | 2/1975 | Mingus | F16L 37/35 277/618 |
| 4,086,939 | A * | 5/1978 | Wilcox | F16L 37/34 251/149.6 |
| 4,219,048 | A * | 8/1980 | Ekman | F16L 37/34 137/614.04 |
| 4,289,164 | A * | 9/1981 | Ekman | F16L 37/23 137/614.03 |
| 4,510,969 | A * | 4/1985 | Rodth | F16L 37/107 137/614.04 |
| 4,607,670 | A * | 8/1986 | Compton | F15B 7/005 303/64 |
| 4,674,535 | A * | 6/1987 | de Menibus | F16L 29/04 251/282 |
| 4,819,692 | A * | 4/1989 | Olson | F16L 29/04 137/614.06 |
| 4,886,301 | A * | 12/1989 | Remsburg | F16L 37/56 285/39 |
| 5,123,448 | A * | 6/1992 | Kjellberg | F16L 37/23 251/149.6 |
| 5,215,122 | A * | 6/1993 | Rogers | F16L 29/04 251/149.6 |
| 5,316,347 | A * | 5/1994 | Arosio | E02F 3/3654 285/85 |
| 5,337,782 | A * | 8/1994 | Wilcox | F16L 37/35 251/149.6 |
| 5,406,980 | A * | 4/1995 | Allread | F16L 37/32 285/319 |
| 5,662,141 | A * | 9/1997 | Arosio | F16L 37/34 137/614.05 |
| 6,032,010 | A * | 2/2000 | Kim | B41J 2/1755 222/DIG. 1 |
| 6,041,805 | A * | 3/2000 | Gydesen | F16L 37/35 137/614.04 |
| 6,161,578 | A | 12/2000 | Braun et al. | |
| 6,170,522 | B1 * | 1/2001 | Tanida | F16L 39/00 137/614.04 |
| 6,176,263 | B1 | 1/2001 | Lacroix et al. | |
| 7,168,794 | B2 * | 1/2007 | Wouters | F16L 29/04 347/84 |
| 7,484,530 | B2 * | 2/2009 | Harvey | F16L 37/34 137/614.04 |
| 7,708,029 | B2 * | 5/2010 | Kitagawa | F16L 37/34 251/149.6 |
| 7,762,279 | B2 * | 7/2010 | Zeiber | F16L 29/04 251/149.6 |
| 7,942,163 | B2 * | 5/2011 | Sauer | F16L 37/26 137/614.06 |
| 9,016,314 | B2 * | 4/2015 | Eriksen | H05K 7/20763 137/614.04 |
| 9,194,524 | B2 * | 11/2015 | Konishi | F16L 37/36 |
| 9,217,524 | B2 * | 12/2015 | Nick | F16L 29/04 |
| 9,279,530 | B2 * | 3/2016 | Schmidt | F16L 37/0841 |
| 9,291,293 | B2 * | 3/2016 | Prust | F16L 37/35 |
| 9,739,367 | B2 * | 8/2017 | Kujawski, Jr. | F16H 61/0009 |
| 10,828,481 | B2 * | 11/2020 | Truong | A61M 39/18 |
| 11,184,999 | B2 * | 11/2021 | Chen | F16L 37/35 |
| 11,215,300 | B2 * | 1/2022 | Hayashi | F16L 39/04 |
| 11,486,528 | B2 * | 11/2022 | Nick | F16L 37/23 |
| 11,619,332 | B2 * | 4/2023 | Jenski, Jr. | F16L 37/34 137/798 |
| 11,619,334 | B2 * | 4/2023 | Langer | F16L 37/56 285/66 |
| 11,746,942 | B2 * | 9/2023 | Durieux | F16L 29/04 251/149.6 |
| 11,747,025 | B2 * | 9/2023 | Ingram | F24F 1/34 62/259.1 |
| 11,788,660 | B2 * | 10/2023 | Wall | F16L 37/34 137/614.06 |
| 11,815,214 | B2 * | 11/2023 | Nick | H05K 7/20272 |
| 11,873,934 | B2 * | 1/2024 | Durieux | F16L 37/35 |
| 11,892,252 | B2 * | 2/2024 | Yang | H05K 7/20772 |
| 11,982,451 | B1 * | 5/2024 | Ingram | F24F 1/0003 |
| 11,987,488 | B2 * | 5/2024 | Summermann | F16L 37/32 |
| 12,007,055 | B2 * | 6/2024 | Abraham Carabano | F16L 37/086 |
| 12,044,338 | B2 * | 7/2024 | Durieux | F16L 27/00 |
| 2007/0025811 | A1 * | 2/2007 | Wilhelm | F16L 37/34 403/300 |
| 2010/0254758 | A1 | 10/2010 | Campbell et al. | |
| 2015/0001844 | A1 | 1/2015 | Tiberghien et al. | |
| 2015/0377402 | A1 | 12/2015 | Boothe et al. | |
| 2016/0305591 | A1 * | 10/2016 | Chen | F16L 37/35 |
| 2017/0191595 | A1 | 7/2017 | Van Scyoc | |
| 2017/0307122 | A1 * | 10/2017 | Imoto | F16L 37/22 |
| 2019/0323727 | A1 * | 10/2019 | Ingram | F24F 1/20 |
| 2019/0368642 | A1 | 12/2019 | Saga et al. | |
| 2023/0136128 | A1 * | 5/2023 | Chang | F16L 37/50 137/614.05 |
| 2024/0280201 | A1 * | 8/2024 | Stoll | F16L 37/36 |

FOREIGN PATENT DOCUMENTS

| | | |
|---|---|---|
| CN | 202171081 U | 3/2012 |
| CN | 102878376 A | 1/2013 |
| CN | 203023703 U | 6/2013 |
| CN | 203202480 U | 9/2013 |
| CN | 104251357 A | 12/2014 |
| CN | 104295839 A | 1/2015 |
| CN | 104633348 A | 5/2015 |
| CN | 104864209 A | 8/2015 |
| CN | 2016161066 A | 9/2016 |
| CN | 205716166 U | 11/2016 |
| CN | 106996493 A | 8/2017 |
| CN | 206708610 U | 12/2017 |
| CN | 206846149 U | 1/2018 |
| CN | 107917297 A | 4/2018 |
| CN | 107975644 A | 5/2018 |
| CN | 208417895 U | 1/2019 |
| CN | 105953008 B | 2/2019 |
| CN | 109944994 A | 6/2019 |
| CN | 208951500 U | 6/2019 |
| CN | 208997530 U | 6/2019 |
| CN | 110500463 A | 11/2019 |
| DE | 102014009063 A1 | 12/2015 |
| FR | 1561337 A | 3/1969 |
| FR | 2520479 A1 | 7/1983 |
| IT | MI20121865 A1 | 5/2014 |
| JP | 2008106920 A | 5/2008 |
| JP | 2016118235 A | 6/2016 |
| JP | 2018204703 A | 12/2018 |
| JP | 2019027562 A | 2/2019 |

(56) References Cited

FOREIGN PATENT DOCUMENTS

| WO | 2014155275 A1 | 10/2014 |
|---|---|---|
| WO | 2018138997 A1 | 8/2018 |

* cited by examiner

JOINT, COOLING SYSTEM, AND COMPUTER APPARATUS

CROSS-REFERENCE TO RELATED APPLICATIONS

This is a continuation of International Patent Application No. PCT/CN2020/102223 filed on Jul. 15, 2020, which claims priority to Chinese Patent Application No. 201910646039.3 filed on Jul. 17, 2019. The disclosures of the aforementioned applications are hereby incorporated by reference in their entireties.

TECHNICAL FIELD

This application relates to the field of joint technologies, and in particular, to a joint, a cooling system, and a computer apparatus.

BACKGROUND

A joint is a connection structure capable of connecting or disconnecting pipes. A circulated medium in the pipes may be gas, liquid, or the like. During actual application, the connection structure has different structural characteristics and advantages/disadvantages depending on specific requirements.

With continuous development of science and technology, processing performance of some electronic devices (for example, a processor or a memory) is significantly improved. However, power and heat emission of the electronic devices also significantly increase. To prevent operation performance of the electronic devices from being affected by an excessively high temperature, the industry has a higher requirement on heat dissipation performance of a heat dissipation system. Conventional heat dissipation systems are mainly air-cooled structures, whose operation principle is to perform rapid air circulation to take away heat generated by an electronic device. However, as the electronic device emits more and more heat, an air-cooled heat dissipation manner cannot meet a requirement. Therefore, a liquid cooling manner is gradually used in the industry to dissipate heat for electronic devices. A connection structure is a main component of a liquid cooling system, and operational reliability of the connection structure directly affects operational stability of the entire liquid cooling system. However, current connection structures in the industry all have problems, and cannot match a liquid cooling system well. Therefore, the conventional connection structures still need improvements.

SUMMARY

This application provides a joint that can effectively prevent medium leakage and is reliable in use, a cooling system using the joint, and a computer apparatus.

In one aspect, an embodiment of this application provides a joint, including a male module and a female module capable of docking with each other. The male module includes a core rod and a sliding cylinder, and the sliding cylinder is slidably sleeved on an outer periphery of the core rod. A first valve port is disposed in the sliding cylinder, and the core rod is provided with a piston head that is in hermetic fit with the first valve port. The female module includes a valve body and a piston. A first channel is disposed in the valve body, the piston is slidably disposed in the first channel, and a second valve port that is in hermetic fit with the piston is disposed in the first channel. One end of the sliding cylinder is provided with a first docking port, the valve body is provided with a second docking port communicating with the first channel, and after the first docking port and the second docking port are docked hermetically, the core rod slides in a direction of extending from the first docking port, the piston head is separated from the first valve port, the core rod sliding pushes the piston to slide in a direction of retracting into the second docking port, and the piston is separated from the second valve port.

In summary, in the joint in this embodiment of this application, when not docked with each other, the male module and the female module are both in a blocked state, to prevent medium leakage. When the male module and the female module are docked with each other, the first docking port of the male module and the second docking port of the female module are first docked hermetically, and then communicate with each other, so that medium leakage can be effectively prevented. Further, in a docking process, the core rod in the male module slides to the female module, the piston head is separated from the first valve port, and a flow channel inside the male module is unblocked. At the same time, the core rod pushes the piston in the female module to slide, the piston is separated from the second valve port, and a flow channel inside the female module is unblocked. In this way, the male module and the female module are docked and communicate with each other. This can effectively unblock the flow channel inside the male module and the flow channel inside the female module, to avoid problems of docking failure and flow channel blocking.

To enable the piston head and the first valve port to be in a state of hermetic contact when the male module is not docked with the female module, to prevent medium leakage, in some embodiments, the male module may further include a first tightening spring. The first tightening spring acts on the core rod and the sliding cylinder, and is configured to drive the core rod to slide in a direction of retracting into the first docking port, so that the piston head is in hermetic contact with the first valve port.

During specific implementation, the first tightening spring may be a coil spring, and sleeved on the outer periphery of the core rod. One end of the first tightening spring is connected to a sleeve and the other end is connected to the core rod, so that the core rod slides in a direction of retracting into the first docking port under an elastic force of the first tightening spring. Certainly, to ensure that under an acting force of the first tightening spring, the core rod stops further sliding when the piston head is in hermetic combination with the first valve port, further, a first stopper may be disposed on the core rod, and a second stopper may be disposed in the sliding cylinder. When the core rod slides until the piston head is in hermetic combination with the first valve port, the first stopper abuts the second stopper, so that the piston head and the first valve port can be kept in a state of hermetic contact, to prevent medium leakage.

In addition, to enable the piston and the second valve port to be in a state of hermetic contact when the female module is not docked with the male module, in some embodiments, the female module may further include a second tightening spring. The second tightening spring acts on the piston and the valve body, and is configured to drive the piston to slide in a direction of extending from the second docking port, so that the piston is in hermetic contact with the second valve port.

During specific implementation, the second tightening spring may be a coil spring. The second tightening spring may be disposed in the first channel, one end of the second tightening spring is connected to the piston, and the other end is connected to the valve body, so that the piston slides in the direction of extending from the second docking port. Certainly, to ensure that under an acting force of the second tightening spring, the piston stops further sliding when the piston is in hermetic contact with the second valve port, a stopping surface may be disposed at the second valve port, and correspondingly, the piston may be provided with a stopping surface. Under the acting force of the second tightening spring, when the piston is in hermetic contact with the second valve port, the stopping surface of the piston abuts the stopping surface of the second valve port to prevent the piston from further sliding, so that the piston and the second valve port are kept in a state of hermetic contact, to prevent medium leakage.

In addition, the flow channel in the male module may be disposed in a plurality of forms. For example, the flow channel may be disposed only in a clearance between the core rod and the sliding cylinder, or a part of the flow channel may be disposed in the clearance between the core rod and the sliding cylinder and the other part may be disposed in the core rod.

For example, in a specific implementation provided in this application, a part of the flow channel is disposed in the clearance between the core rod and the sliding cylinder, and the other part is disposed in the core rod. After connected to the core rod, an external pipe can communicate with the flow channel in the male module. Further, a clearance communicating with the first valve port is disposed between the core rod and the sliding cylinder, a sealing part is disposed in the clearance, and the sealing part is slidably in hermetic contact with an outer wall of the core rod and an inner wall of the sliding cylinder. A second channel communicating with the outside and an opening communicating with the second channel and the clearance are disposed in the core rod. The opening is located between the sealing part and the piston head. Further, one end of the second channel communicates with the outside for docking with an external pipe, and the other end communicates with the clearance between the core rod and the sliding cylinder through the opening.

During specific implementation, to facilitate manufacturing, reduce material costs, and the like, the first valve port and the first docking port may be both located at a first end of the sliding cylinder, the piston head may be located at a first end of the core rod, and the first end of the sliding cylinder and the first end of the core rod are located in a same direction. Certainly, in another implementation, the first valve port may alternatively be disposed in a middle part of the sliding cylinder or at another position, and the piston head may alternatively be disposed in a middle part of the core rod or at another position.

In addition, when the male module and the female module are docked with each other, to prevent the male module and the female module from being separated and keep a state of communicating with each other, a connection structure may be further disposed in the male module and the female module. For example, in an embodiment provided in this application, the male module may further include a seat body, and the seat body is fixedly connected to the core rod. The seat body is provided with a first connecting portion capable of connecting to the valve body, the valve body is provided with a second connecting portion capable of connecting to the first connecting portion, and after the first docking port and the second docking port are docked hermetically, the first connecting portion and the second connecting portion are connected, so that the core rod tightly abuts the piston.

During specific implementation, a connection manner between the first connecting portion and the second connecting portion is any one of clamping, threaded connection, or welding, or another connection manner is used.

For example, in a specific implementation provided in this application, the male module and the female module are connected through clamping. Further, the seat body is provided with a first connecting ring, and a clamping groove is disposed on an outer periphery of the first connecting ring. The valve body is provided with a second connecting ring and a stopping ring slidably sleeved on an outer periphery of the second connecting ring. The second connecting ring is provided with a bead hole penetrating an inner wall and an outer wall of the second connecting ring, a clamp bead is disposed in the bead hole, a diameter of an inner port of the bead hole is less than a diameter of the clamp bead, and a diameter of an outer port of the bead hole is not less than the diameter of the clamp bead. An inner wall of the stopping ring is provided with a first stopping surface and a second stopping surface. The first connecting ring is inserted into the second connecting ring, and when the first stopping surface slides to the outer port, the first stopping surface pushes the clamp bead to be clamped in the clamping groove, and when the second stopping surface slides to the outer port, the clamp bead can be separated from the clamping groove, and a distance between the second stopping surface and the outer port is less than the diameter of the clamp bead.

Further, the clamp bead may roll freely in the bead hole. When the clamp bead rolls to the inner port, a part of the clamp bead extends into the second connecting ring, and the extended part may be clamped in the clamping groove of the first connecting ring. Certainly, to keep such a clamped state, the first stopping surface of the stopping ring may be slid to the outer port of the bead hole to prevent the clamp bead from rolling in a direction towards the outer port, so that the clamp bead and the clamping groove are kept in a clamping relationship, and the male module and the female module are connected through clamping. When the male module and the female module need to be separated, the second stopping surface of the stopping ring may be slid to the outer port of the bead hole. Because the distance between the second stopping surface and the outer port is greater than a distance between the first stopping surface and the outer port, the clamp bead may be allowed to roll in the direction towards the outer port, and the clamp bead may be disengaged from the clamping groove. In addition, to prevent the clamp bead from completely rolling out from the outer port and falling, the distance between the second stopping surface and the outer port needs to be less than the diameter of the clamp bead.

In addition, because the stopping ring may slide freely relative to the second connecting ring, after the male module and the female module are docked, to ensure that the clamp bead is kept clamped in the clamping groove, in an embodiment provided in this application, the female module may further include a third tightening spring. The third tightening spring acts on the stopping ring and the second connecting ring or the valve body, and is configured to drive the first stopping surface of the stopping ring to slide to the outer port of the bead hole, so that the first stopping surface functions to limit the clamp bead, to prevent the clamp bead from being disengaged from the clamping groove.

In another implementation, to improve stability and reliability of the docking between the male module and the female module, the male module may further include a fixing sleeve. Further, the fixing sleeve may be fixedly connected to the core rod, the fixing sleeve is sleeved on an outer periphery of the sliding cylinder, and at least a part of the valve body may be sleeved in the fixing sleeve. When the male module and the female module are docked with each other, one end of the valve body can extend into the fixing sleeve through one end of the fixing sleeve. Through insert fit between the fixing sleeve and the valve body, coaxiality between the male module and the female module can be effectively improved, to prevent tilt and shake and radial position deviation between the male module and the female module, thereby effectively ensuring a connection effect and hermeticity between the sliding cylinder and the valve body. During specific configuration, the fixing sleeve and the valve body may be assembled in a clearance fit manner, to ensure that the valve body can be inserted into the fixing sleeve relatively smoothly. In addition, position accuracy between the valve body and the fixing sleeve can be effectively ensured.

During actual use, the joint may be applied to different devices.

For example, an embodiment of this application further provides a cooling system, including a function device and a cooling pipe. The function device communicates with the cooling pipe through the foregoing joint. In some specific implementations, the function device may include an evaporator, a condenser, a liquid pump, and the like, and a medium in the cooling pipe may be gas, liquid, or the like. In an actual use process, the female module may be disposed in the function device, the male module is disposed at one end of the cooling pipe, and the function device and the cooling pipe may communicate with each other by docking the female module and the male module, to facilitate medium circulation.

Certainly, the joint and the cooling system may be further applied, based on different requirements, to apparatuses that need to be cooled.

For example, an embodiment of this application further provides a computer apparatus, including an electronic component. Further, the electronic component may be a processor, a memory, or the like. The computer apparatus may be a desktop computer, a notebook computer, a tablet computer, a server, or the like. The server is used as an example. As a large amount of heat is generated during running of the server, to ensure normal running of the server, the server may be cooled by using the foregoing cooling system.

DESCRIPTION OF EMBODIMENTS

To make the objectives, technical solutions, and advantages of this application clearer, the following further describes this application in detail with reference to the accompanying drawings.

To facilitate understanding of a joint provided in the embodiments of this application, the following first describes an application scenario of the joint.

The joint provided in the embodiments of this application may be applied to different pipe devices, to implement rapid docking and connection between pipes, to meet a requirement for medium circulation in the pipes.

Figure 1:
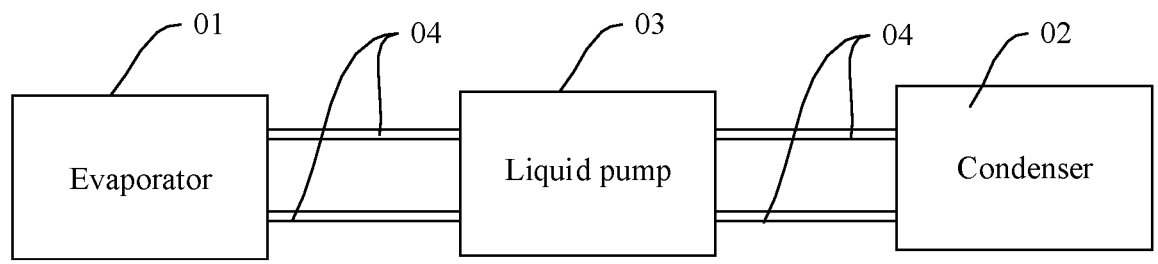
FIG. 1 is a schematic structural diagram of a liquid cooling system according to an embodiment of this application.

A liquid cooling system is used as an example. The liquid cooling system simply means that liquid (such as water or oil) is used as a cooling medium to assist in taking away heat generated by a heat emitting component, to achieve a cooling objective. As shown in FIG. 1, a liquid cooling system generally includes an evaporator 01, a condenser 02, and a liquid pump 03 that communicate with each other through a pipe 04. The evaporator 01 is generally disposed close to a heat emitting component. A temperature of the heat emitting component is reduced by absorbing heat generated by the heat emitting component. The condenser 02 is generally disposed close to a cooling source, and is configured to cool a medium in the pipe 04. The liquid pump 03 is configured to drive circulation of the medium in the pipe, so that the medium circulates between the condenser 02 and the evaporator 01, and finally achieves an objective of cooling the heat emitting component. In an actual use process, the condenser 02, the evaporator 01, and the liquid pump 03 all need to be docked with the pipe by using joints. Therefore, performance of the joints is particularly important.

Figure 2:
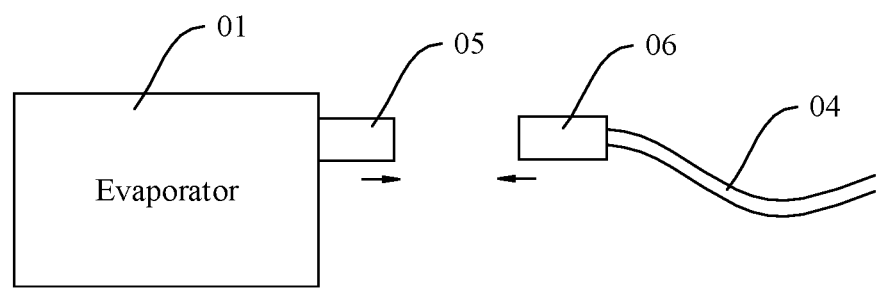
FIG. 2 is a schematic diagram of a partial structure of FIG. 1.

As shown in FIG. 2, the evaporator 01 is used as an example. To implement rapid docking between the evaporator 01 and the pipe 04, a joint 05 is generally installed in the evaporator 01, and a corresponding end of the pipe 04 is provided with another joint 06 for docking with the joint 05 of the evaporator 01. When not docked, the two joints are both in a blocked state to prevent medium leakage from the joints. After the two joints are docked with each other, respective components of the two joints interact to cause the two joints to be both in an open state, so that the medium in the pipe 04 can flow into the evaporator 01, and/or the medium in the evaporator 01 can flow into the pipe 04.

However, conventional joints still have problems. For example, some joints are prone to medium leakage when docked with each other, or some joints are prone to failure when docked with each other. As a result, a medium cannot flow or cannot flow smoothly between two joints.

Therefore, the embodiments of this application provide a joint that can effectively prevent medium leakage and is reliable in use.

Terms used in the following embodiments are merely for the purpose of describing specific embodiments, but are not intended to limit this application. The terms "one", "a" and "the" of singular forms used in this specification and the appended claims of this application are also intended to include expressions such as "one or more", unless otherwise specified in the context clearly. It should be further understood that in the following embodiments of this application, "at least one" and "one or more" refer to one, two, or more. The term "and/or" is used to describe an association relationship of associated objects and represents that three relationships may exist. For example, A and/or B may represent the following three cases: only A exists, both A and B exist, and only B exists, where A and B may be singular or plural. The character "/" generally indicates an "or" relationship between the associated objects.

Reference to "an embodiment", "some embodiments", or the like described in this specification means that one or more embodiments of this application include a specific feature, structure, or feature described with reference to the embodiment. Therefore, statements "in an embodiment", "in some embodiments", "in some other embodiments", and the like that appear in different parts of this specification do not necessarily refer to a same embodiment, but mean "one or more but not all of the embodiments", unless otherwise specified. Terms "including", "comprising", "provided with" and their variations all mean "including but not limited to", unless otherwise specified.

Figure 3:
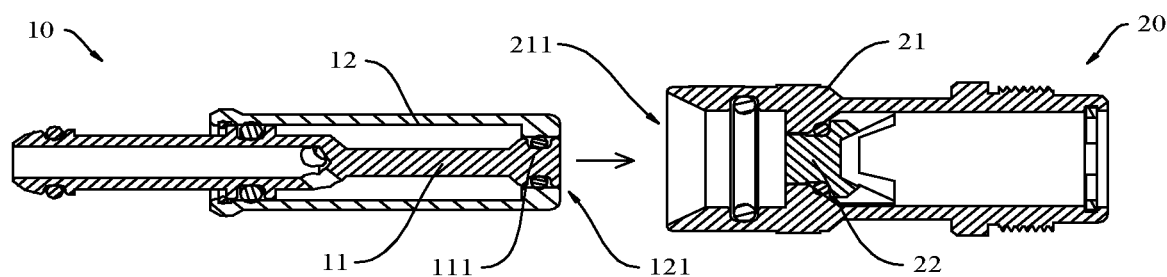
FIG. 3 is a schematic diagram of a cross-sectional structure of an interface according to an embodiment of this application.
Figure 4:
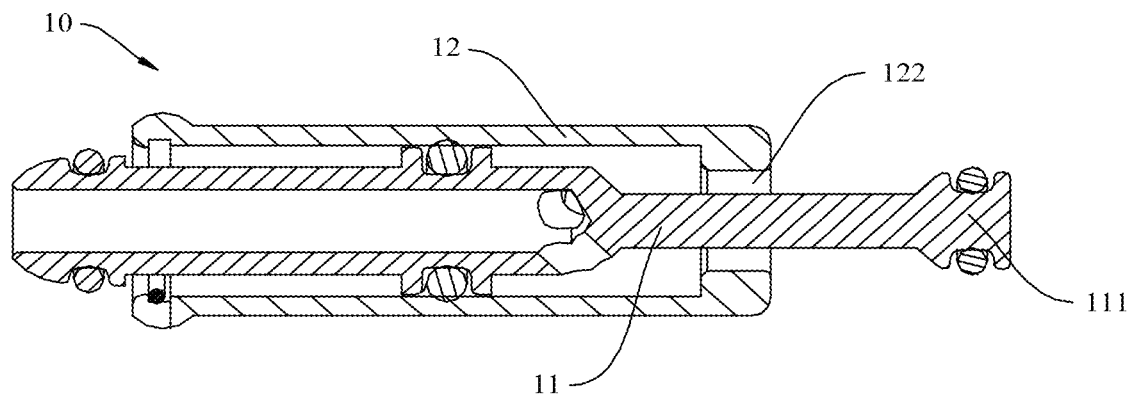
FIG. 4 is a schematic diagram of a cross-sectional structure of a male module according to an embodiment of this application.

As shown in FIG. 3, in an embodiment provided in this application, a joint includes a male module 10 and a female module 20 capable of docking with each other. The male module 10 includes a core rod 11 and a sliding cylinder 12, and the sliding cylinder 12 is slidably sleeved on an outer periphery of the core rod 11. The female module 20 includes a valve body 21 and a piston 22, and the piston 22 is slidably disposed in the valve body 21. In the male module 10, one end of the sliding cylinder 12 is provided with a first docking port 121. In the female module 20, the valve body 21 is provided with a second docking port 211 for docking with the first docking port 121. In summary, in the joint in this embodiment of this application, when not docked with each other, the male module 10 and the female module 20 are both in a blocked state, to prevent medium leakage. When the male module 10 and the female module 20 are docked with each other, the first docking port 121 of the male module 10 and the second docking port 211 of the female module 20 are first docked hermetically, and then communicate with each other, so that medium leakage can be effectively prevented. Further, as shown in FIG. 4, in a docking process, the core rod 11 in the male module 10 slides to the female module 20, and a piston head 111 on the core rod 11 is separated from a first valve port 122 in the sliding cylinder 12, to unblock a flow channel inside the male module 10. A medium may pass through an opening in the core rod 11 and through a clearance between the core rod 11 and the sleeve 12, and flow from the first valve port 122. At the same time, the core rod 11 pushes the piston 22 in the female module 20 to slide, and the piston 22 is separated from the second valve port 212 in the valve body 21, to unblock a flow channel inside the female module 20. In this way, the male module 10 and the female module 20 are docked and communicate with each other. This can effectively unblock the flow channel inside the male module 10 and the flow channel inside the female module 20, to avoid problems of docking failure and flow channel blocking.

Further, as shown in FIG. 4, in an embodiment provided in this application, the male module 10 includes a core rod 11 and a sliding cylinder 12, the sliding cylinder 12 is slidably disposed on an outer periphery of the core rod 11, a first valve port 122 is disposed in the sliding cylinder 12, and the core rod 11 is provided with a piston head 111 that is in hermetic fit with the first valve port 122. A flow channel inside the male module 10 is unblocked or blocked through relative sliding between the core rod 11 and the sliding cylinder 12. Further, in a process in which the core rod 11 slides relative to the sliding cylinder 12, when the piston head 111 is in hermetic combination with the first valve port 122, the flow channel in the male module 10 is in a blocked state. When the piston head 111 is not in hermetic combination with the first valve port 122, the flow channel in the male module 10 is in an unblocked state.

During specific implementation, a position of the first valve port 122 and a position of the piston head 111 may be disposed in a plurality of manners.

Figure 5:
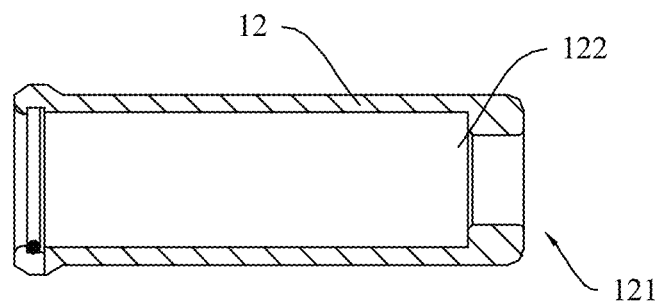
FIG. 5 is a schematic diagram of a cross-sectional structure of a sliding cylinder according to an embodiment of this application.
Figure 6:
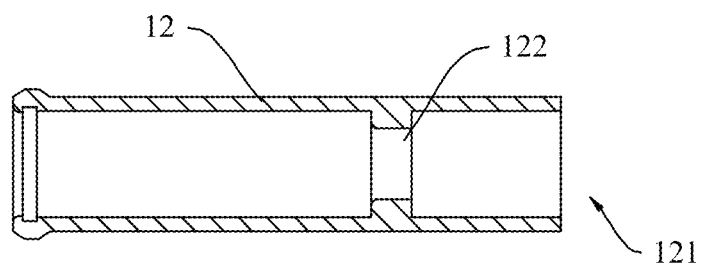
FIG. 6 is a schematic diagram of a cross-sectional structure of another sliding cylinder according to an embodiment of this application.

For example, as shown in FIG. 5, in an embodiment provided in this application, the first valve port 122 may be disposed on an end portion of the sliding cylinder 12 that is close to the first docking port 121. Certainly, in another implementation, the first valve port 122 may alternatively be disposed at another position of the sliding cylinder 12. For example, as shown in FIG. 6, in another embodiment provided in this application, the first valve port 122 may be disposed in a middle part of the sliding cylinder 12.

Figure 7:
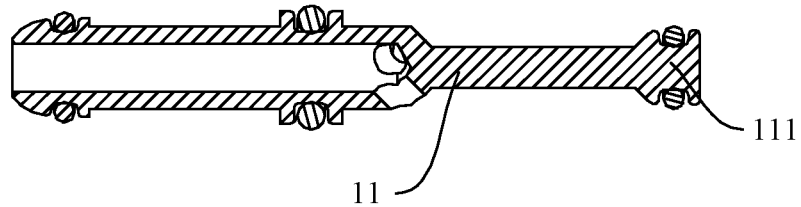
FIG. 7 is a schematic diagram of a cross-sectional structure of a core rod according to an embodiment of this application.
Figure 8:
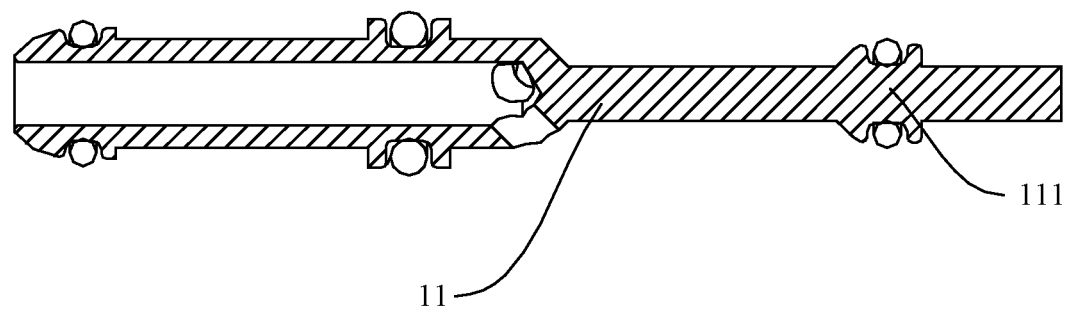
FIG. 8 is a schematic diagram of a cross-sectional structure of another core rod according to an embodiment of this application.

In addition, as shown in FIG. 7, in an embodiment provided in this application, the piston head 111 may be disposed on an end portion of the core rod 11. Certainly, in another implementation, the piston head 111 may alternatively be disposed at another position of the core rod 11. For example, as shown in FIG. 8, in another embodiment provided in this application, the piston head 111 may alternatively be disposed in a middle part of the core rod 11.

Figure 9:
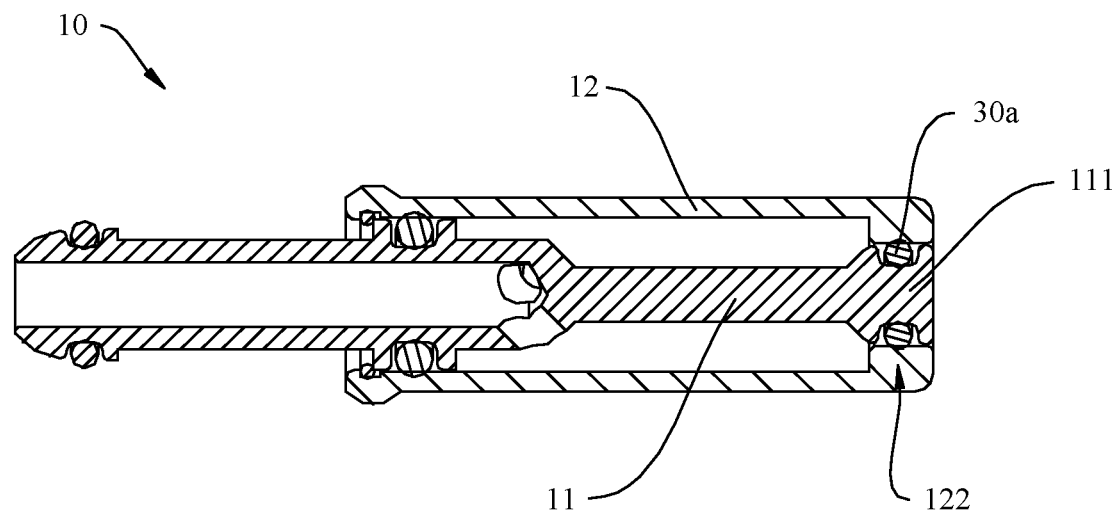
FIG. 9 is a schematic diagram of a cross-sectional structure of another male module according to an embodiment of this application.

During specific implementation, to ensure hermeticity between the piston head 111 and the first valve port to prevent medium leakage, as shown in FIG. 9, in an embodiment provided in this application, a sealing ring 30a is fixed on the piston head 111. When the piston head 111 slides to the first valve port 122, the sealing ring 30a can be in hermetic contact with the first valve port 122. Certainly, in another embodiment, the sealing ring 30a may alternatively be fixed at the first valve port 122, or the sealing ring 30a may be disposed at both the piston head 111 and the first valve port 122.

In addition, the flow channel in the male module 10 may be disposed in a plurality of forms.

Figure 10:
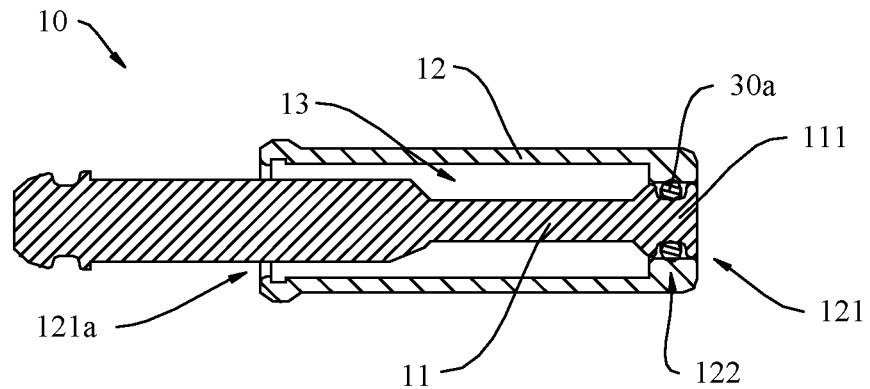
FIG. 10 is a schematic diagram of a cross-sectional structure of still another male module according to an embodiment of this application.

For example, as shown in FIG. 10, in an embodiment provided in this application, the flow channel is located in a clearance 13 between the core rod 11 and the sliding cylinder 12. Further, the flow channel penetrates left and right ends of the sliding cylinder 12, the right end forms the first docking port 121, and the left end forms a docking port 121a for docking with an external pipe.

Figure 11:
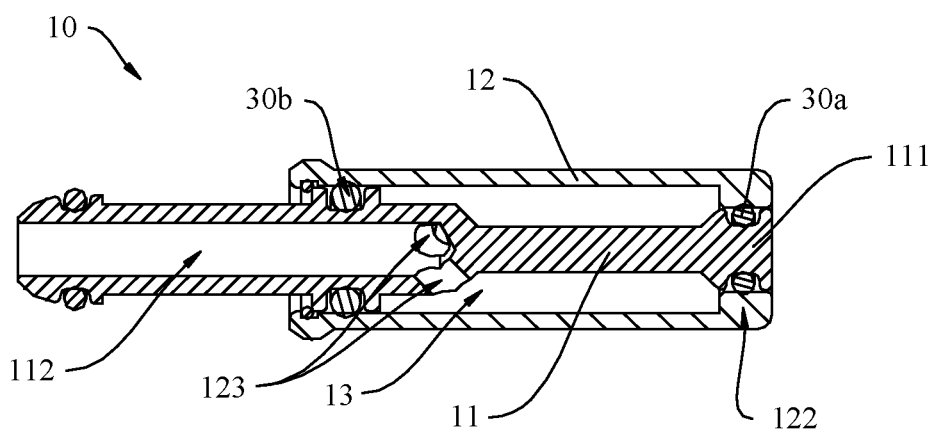
FIG. 11 is a schematic diagram of a cross-sectional structure of another male module according to an embodiment of this application.

Certainly, in another implementation, a part of the flow channel may alternatively be disposed in the core rod 11. Further, as shown in FIG. 11, in another embodiment provided in this application, a clearance 13 communicating with the first valve port 122 is disposed between the core rod 11 and the sliding cylinder 12, a sealing part 30b is disposed in the clearance 13, and the sealing part 30b is slidably in hermetic contact with an outer wall of the core rod 11 and an inner wall of the sliding cylinder 12. A second channel 112 communicating with the outside and an opening 123 communicating with the second channel 112 and the clearance 13 are disposed in the core rod 11. The opening 123 may be located between the sealing part 30b and the piston head 111.

Further, the second channel 112 penetrating a left end of the core rod 11 is disposed in the core rod 11, and the second channel 112 communicates with the inside of the sliding cylinder 12 through the opening 123 disposed on the core rod 11, to communicate with the first docking port 121 of the sliding cylinder 12. Certainly, to prevent medium leakage from the left end of the sliding cylinder 12, the sealing part 30b is disposed between the core rod 11 and the sliding cylinder 12. When the core rod 11 slides relative to the sliding cylinder 12, the sealing part 30b can be kept in hermetic contact with the inner wall of the sliding cylinder 12 and the outer periphery of the core rod 11.

During specific implementation, the sealing part 30b may be fixed on the core rod 11 or may be fixed in the sliding cylinder 12.

For example, still refer to FIG. 11. In an embodiment provided in this application, the sealing part 30b may be a sealing ring fixed on the core rod 11. When the core rod 11 slides relative to the sliding cylinder 12, the sealing ring can be kept in hermetic contact with the inner wall of the sliding cylinder 12.

Figure 12:
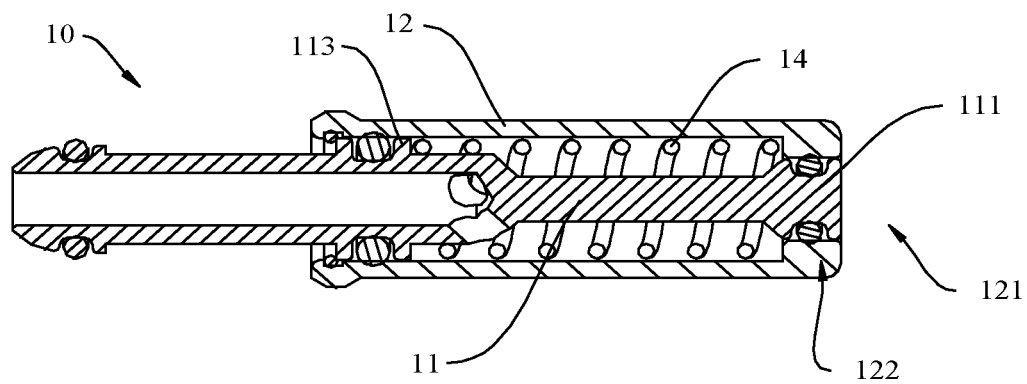
FIG. 12 is a schematic diagram of a cross-sectional structure of a male module in a state according to an embodiment of this application.

To enable the piston head 111 and the first valve port 122 to be in a state of hermetic contact when the male module 10 is not docked with the female module 20, to prevent medium leakage, as shown in FIG. 12, in an embodiment provided in this application, the male module 10 further includes a first tightening spring 14. The first tightening spring 14 acts on the core rod 11 and the sliding cylinder 12, so that the piston head 111 is in hermetic contact with the first valve port 122.

Figure 13:
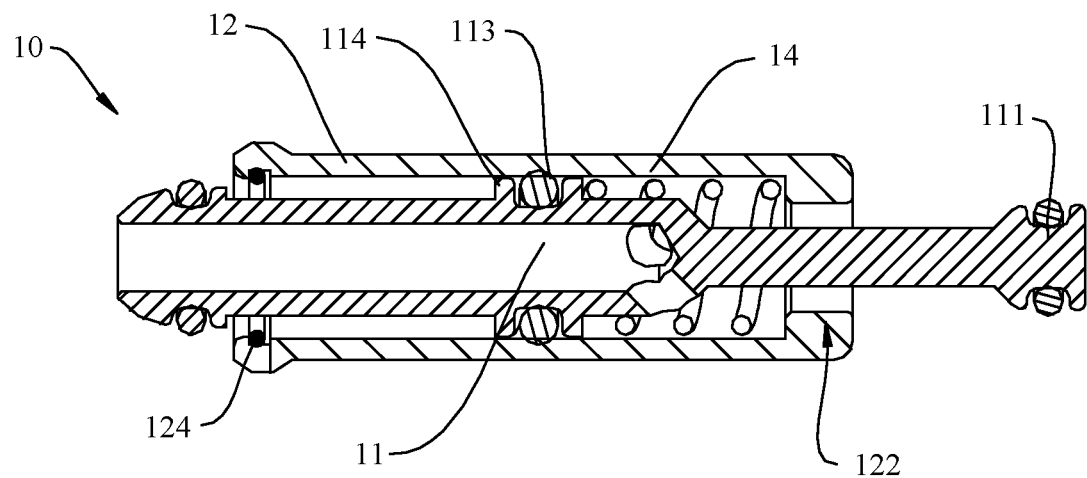
FIG. 13 is a schematic diagram of a cross-sectional structure of a male module in another state according to an embodiment of this application.

As shown in FIG. 12, during specific implementation, the first tightening spring 14 may be a coil spring, and is sleeved on the outer periphery of the core rod 11. One end (right end) of the first tightening spring 14 abuts a (left) side wall of the first valve port 122, and the other end (left end) abuts a stopping ring 113 on the core rod 11, so that the core rod 11 slides (slides to the left) in a direction of retracting into the first docking port 121. Certainly, to ensure that the piston head 111 and the first valve port 122 are in a state of hermetic combination when the core rod 11 slides to a leftmost end under an acting force of the first tightening spring 14, refer to FIG. 13, further, a first stopper 114 may be disposed on the core rod 11, and a second stopper 124 may be disposed in the sliding cylinder 12. When the core rod 11 slides to the left until the piston head 111 is in hermetic combination with the first valve port 122, the first stopper 114 abuts the second stopper 124 to prevent the core rod 11 from further sliding to the left under the acting force of the first tightening spring 14, so that the piston head 111 and the first valve port 122 can be kept in a state of hermetic contact, to prevent medium leakage.

Certainly, in another implementation, the first stopper 114 and the second stopper 124 may be not disposed. For example, shape contours of the piston head 111 and the first valve port 122 may be properly adjusted so that the contour of the piston head 111 is greater than the contour of the first valve port 122, to prevent the piston head 111 from passing through the first valve port 122. Further, when the core rod 11 slides to the left, the piston head 111 and the first valve port 122 can stop each other when in hermetic contact, to prevent the core rod 11 from further sliding to the left, and the piston head 111 and the first valve port 122 are in a state of hermetic contact under an elastic force of the first tightening spring 14. In addition, the elastic force of the first tightening spring 14 may be overcome by frictional resistance generated when the piston head 111 is in hermetic contact with the first valve port 122, so that the piston head 111 and the first valve port 122 are kept in a state of hermetic contact. Alternatively, a length of the first tightening spring 14 may be adaptively adjusted. For example, the piston head 111 and the first valve port 122 may be in a state of hermetic contact when the first tightening spring 14 returns to a natural state (unstretched or uncompressed).

Figure 14:
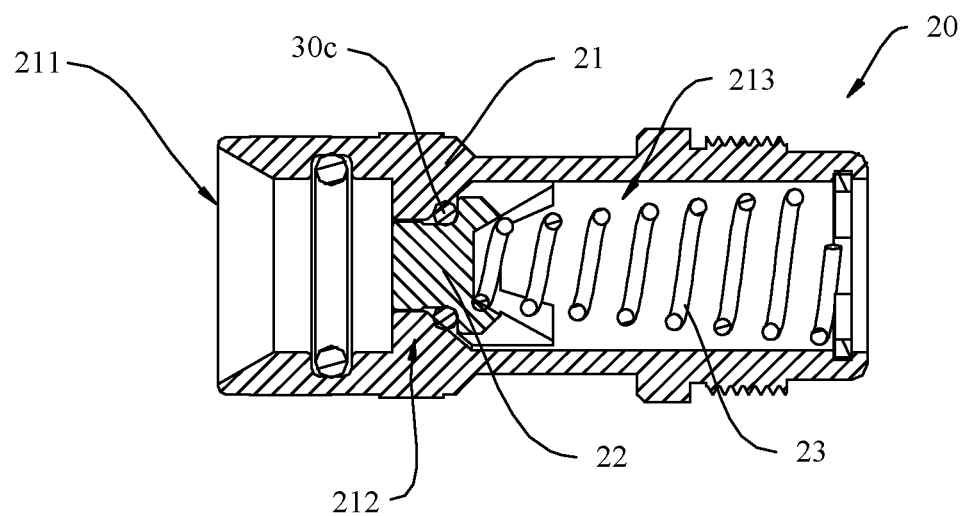
FIG. 14 is a schematic diagram of a cross-sectional structure of a female module in a state according to an embodiment of this application.

In addition, to enable the piston 22 and the second valve port 212 to be in a state of hermetic contact when the female module 20 is not docked with the male module 10, to prevent medium leakage, as shown in FIG. 14, in an embodiment provided in this application, the female module 20 further includes a second tightening spring 23. The second tightening spring 23 acts on the piston 22 and the valve body 21, and is configured to drive the piston 22 to slide in a direction of extending from the second docking port 211, so that the piston 22 is in hermetic contact with the second valve port 212.

Figure 15:
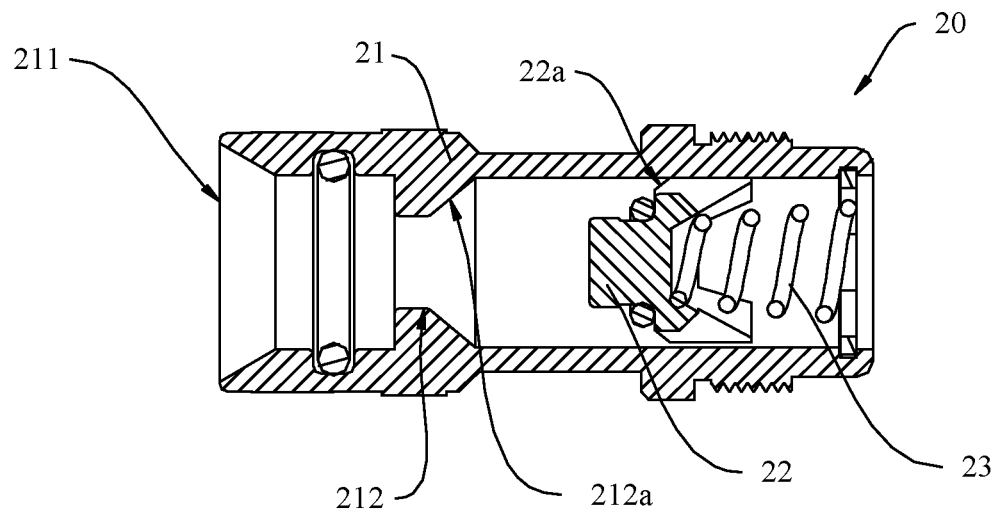
FIG. 15 is a schematic diagram of a cross-sectional structure of a female module in another state according to an embodiment of this application.

As shown in FIG. 14, during specific implementation, the second tightening spring 23 may be a coil spring. The second tightening spring 23 is disposed in a first channel 213, one end (left end) of the second tightening spring is connected to the piston 22, and the other end (right end) is connected to the valve body 21, so that the piston 22 slides (slides to the left) in the direction of extending from the second docking port 211. Certainly, to ensure that the piston 22 and the second valve port 212 are in a state of hermetic contact when the piston 22 slides to a leftmost end under an acting force of the second tightening spring 23, refer to FIG. 15, in an embodiment provided in this application, a stopping surface 212a is disposed at the second valve port 212, and correspondingly, the piston 22 is provided with a stopping surface 22a. Under the acting force of the second tightening spring 23, when the piston 22 is in hermetic contact with the second valve port 212, the stopping surface 212a abuts the stopping surface 22a to prevent the piston 22 from further sliding to the left, so that the piston 22 and the second valve port 212 are in a state of hermetic contact.

Certainly, in another implementation, an elastic force of the second tightening spring 23 may be overcome by frictional resistance generated when the piston 22 is in hermetic contact with the second valve port 212, so that the piston 22 and the second valve port 212 are in a state of hermetic contact. Alternatively, a length of the second tightening spring 23 may be adaptively adjusted. For example, the piston 22 and the second valve port 212 may be in a state of hermetic contact when the second tightening spring 23 returns to a natural state (unstretched and uncompressed).

To improve hermeticity when the piston 22 is in hermetic contact with the second valve port 212, in some implementations, a sealing part 30c may be further disposed between the piston 22 and the second valve port 212. As shown in FIG. 14, during specific implementation, the sealing part 30c may be a sealing ring fixed on the piston 22. When the piston 22 slides to the second valve port 212, the sealing ring 30c can be in hermetic contact with the second valve port 212. Certainly, in another embodiment, the sealing ring 30c may alternatively be fixed at the second valve port 212, or the sealing ring 30c may be disposed at both the piston 22 and the second valve port 212.

Figure 16:
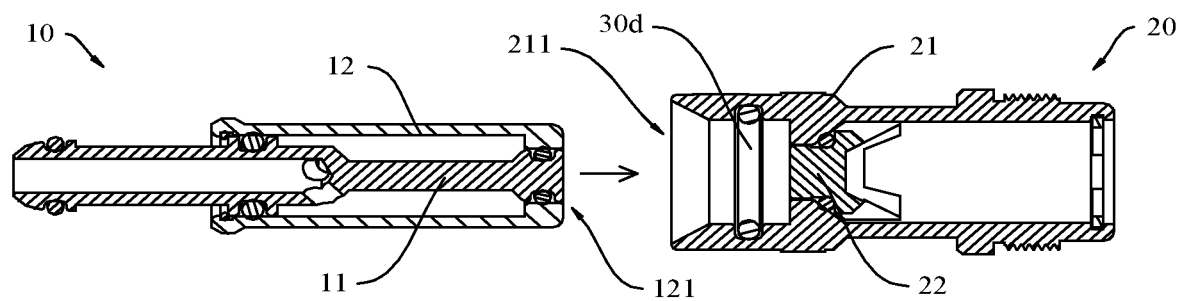
FIG. 16 is a schematic diagram of a cross-sectional structure of a joint according to an embodiment of this application.

In addition, to provide relatively good hermeticity when the female module 20 and the male module 10 are docked, as shown in FIG. 16, in an embodiment provided in this application, a sealing ring 30d is disposed in the second docking port 211 of the valve body 21. When the first docking port 121 of the sliding cylinder 12 is docked with the second docking port 211 of the valve body 21, an outer wall of the sliding cylinder 12 is in hermetic contact with the sealing ring 30d, so that medium leakage between the first docking port 121 and the second docking port 211 can be effectively prevented.

Certainly, in another implementation, the sealing ring 30d may alternatively be disposed at the first docking port 121, or the sealing ring 30d may be disposed at both the first docking port 121 and the second docking port 211.

The following describes in detail a process of docking the male module 10 and the female module 20.

Figure 17:
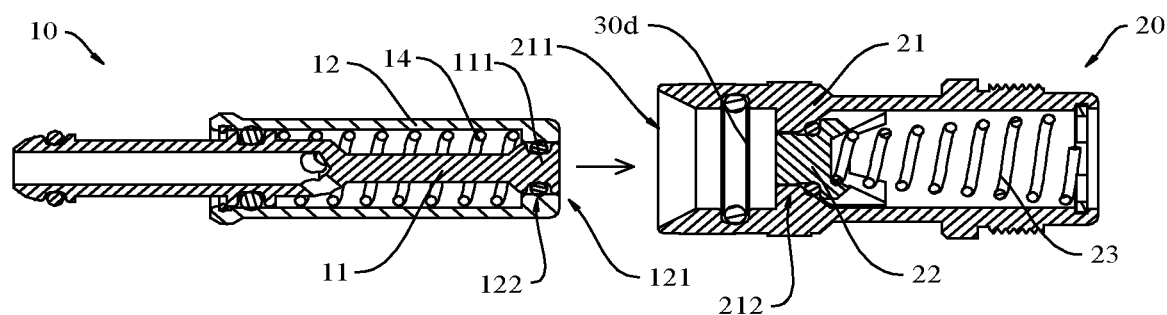
FIG. 17 is a schematic diagram of a cross-sectional structure of another joint in a state according to an embodiment of this application.

As shown in FIG. 17, in this case, the male module 10 is not docked with the female module 20. Under the acting force of the first tightening spring 14, the piston head 111 and the first valve port 122 are in a state of hermetic contact, and the first stopper (not shown in the figure) and the second stopper (not shown in the figure) stop each other, to prevent the core rod 11 from sliding to the left relative to the sliding cylinder 12.

Still refer to FIG. 17. In this case, the female module 20 is not docked with the male module 10. Under the acting force of the second tightening spring 23, the piston 22 and the second valve port 212 are in a state of hermetic contact, and the stopping surface (not shown in the figure) of the second valve port 212 abuts the stopping surface (not shown in the figure) of the piston 22, to prevent the piston 22 from sliding to the left relative to the valve body 21.

Figure 18:
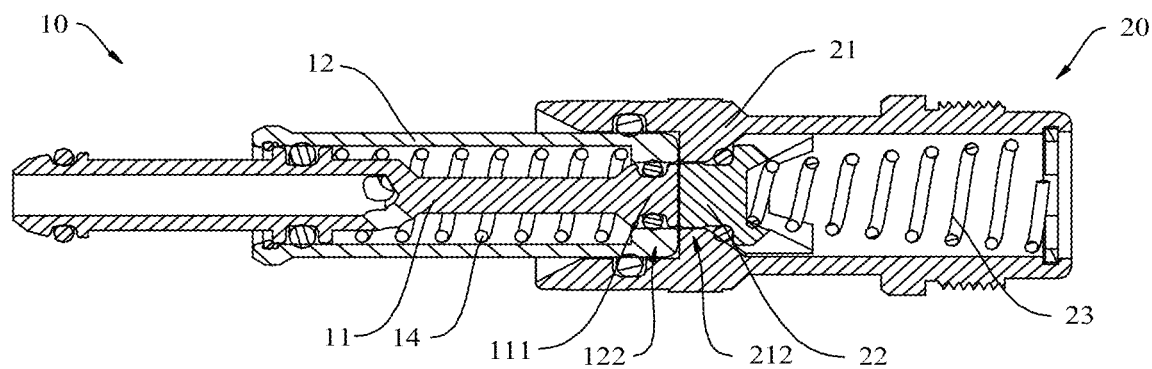
FIG. 18 is a schematic diagram of a cross-sectional structure of another joint in another state according to an embodiment of this application.
Figure 19:
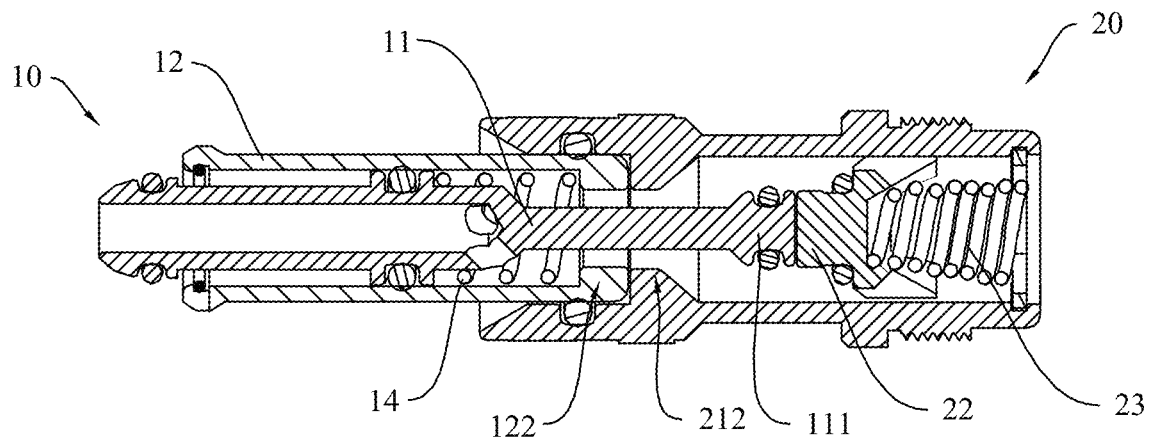
FIG. 19 is a schematic diagram of a cross-sectional structure of another joint in still another state according to an embodiment of this application.

As shown in FIG. 18, when the male module 10 and the female module 20 are docked through sliding, the first docking port 121 at the right end of the sliding cylinder 12 is inserted into the second docking port 211 at the left end of the valve body 21, and hermetic combination is implemented. As shown in FIG. 19, a user may further push the core rod 11 to the right, so that the piston head 111 is gradually separated from the first valve port 122, and the first tightening spring 14 is compressed and deformed. The core rod 11 starts to push the piston 22 to the right, so that the piston 22 is gradually separated from the second valve port 212, and the second tightening spring 23 is compressed and deformed. Finally, the male module 10 and the female module 20 are docked.

Refer to FIG. 18 and FIG. 19. When the male module 10 and the female module 20 are gradually separated from a docked state, an external force is applied to the core rod 11 so that the core rod 11 slides to the left. In this case, the piston head 111 and the first valve port 122 are gradually in hermetic contact. Under the elastic force of the second tightening spring 23, the piston 22 and the second valve port 212 are gradually in hermetic contact. After the piston head 111 and the first valve port 122 are completely in hermetic contact and the piston 22 and the second valve port 212 are completely in hermetic contact, the first stopper (not shown in the figure) of the core rod 11 abuts the second stopper (not shown in the figure) of the sliding cylinder 12. Refer to FIG. 17. When the user further pulls the core rod 11 to the left, the core rod 11 drives the sliding cylinder 12 to slide to the left, so that the sliding cylinder 12 is separated from the valve body 21, and the first docking port 121 is separated from the second docking port 211. Finally, the male module 10 is separated from the female module 20. In this process, the first docking port 121 starts to slide relative to the second docking port 211 only after the piston head 111 and the first valve port 122 are completely in hermetic contact and the piston 22 and the second valve port 212 are completely in hermetic contact. Therefore, medium leakage can be effectively prevented.

Figure 20:
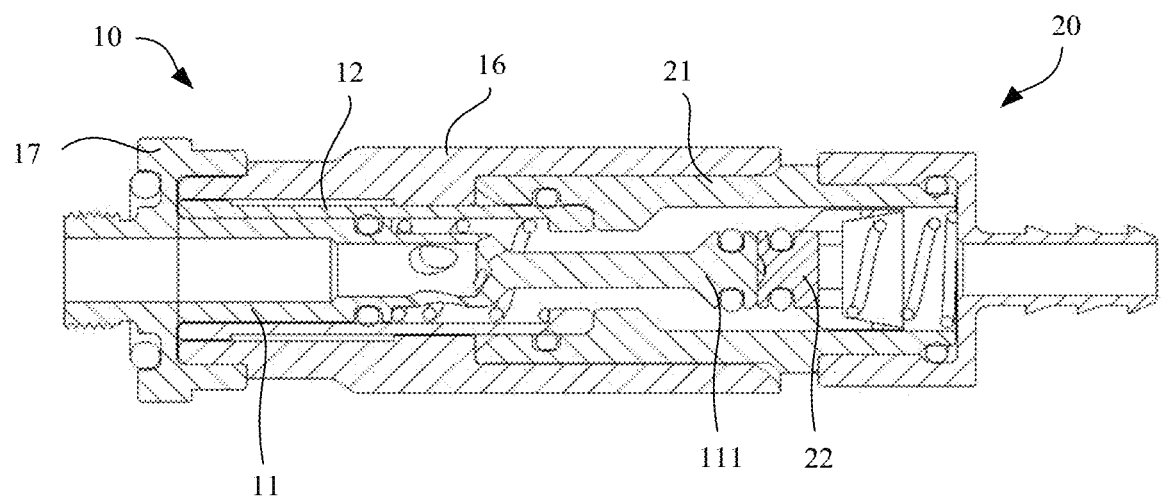
FIG. 20 is a schematic diagram of a cross-sectional structure of still another joint after docking according to an embodiment of this application.

When the male module 10 and the female module 20 are docked with each other, to improve stability and reliability of the docking between the male module 10 and the female module 20, as shown in FIG. 20, in an embodiment provided in this application, the male module 10 further includes a fixing sleeve 16 that is fixedly connected to the core rod 11. The fixing sleeve 16 is sleeved on an outer periphery of the sliding cylinder 12, and at least a part of the valve body 21 can be sleeved in the fixing sleeve 16. Further, in this embodiment provided in this application, to facilitate the fixed connection between the fixing sleeve 16 and the core rod 11, the fixing sleeve 16 and the core rod 11 are fixedly connected by using a connecting seat 17. When the male module 10 and the female module 20 are docked with each other, the left end of the valve body 21 can extend into the fixing sleeve 16. Through insert fit between the fixing sleeve 16 and the valve body 21, coaxiality between the male module 10 and the female module 20 can be effectively improved, to prevent tilt and shake and radial position deviation between the male module 10 and the female module 20, thereby effectively ensuring a connection effect and hermeticity between the sliding cylinder 12 and the valve body 21. During specific configuration, the fixing sleeve 16 and the valve body 21 may be assembled in a clearance fit manner, to ensure that the valve body 21 can be inserted into the fixing sleeve 16 relatively smoothly. In addition, position accuracy between the valve body 21 and the fixing sleeve 16 can be effectively ensured.

During specific implementation, the fixed connection between the fixing sleeve 16 (further, a left end of the fixing sleeve 16) and the connecting seat 17 may be implemented in an interference fit manner. Alternatively, in some other implementations, the fixed connection between the fixing sleeve 16 and the connecting seat 17 may be implemented through threaded connection. This is not limited in this application.

Figure 21:
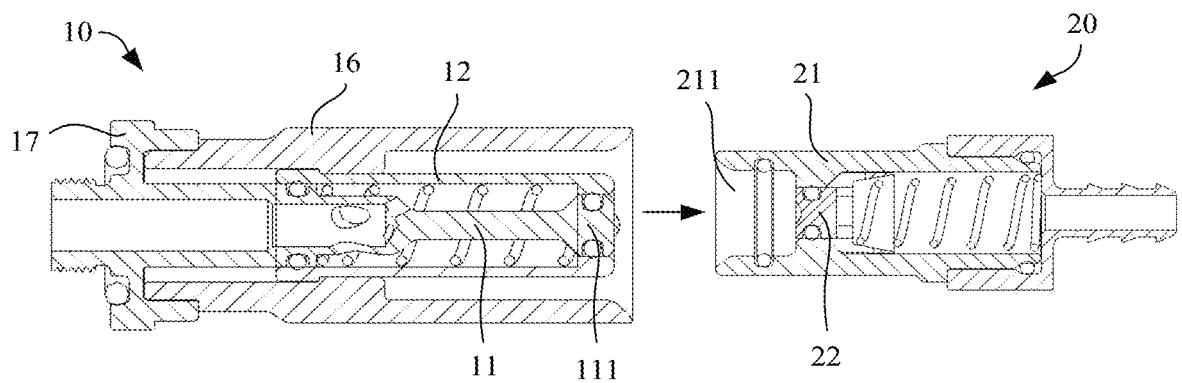
FIG. 21 is a schematic diagram of a cross-sectional structure of still another joint before docking according to an embodiment of this application.

As shown in FIG. 21, during specific configuration, when the male module 10 and the female module 20 are not docked with each other, a right end of the fixing sleeve 16 may be kept flush with the right end of the sliding cylinder 12. When the male module 10 and the female module 20 start to be docked, the sliding cylinder 12 extends into the second docking port 211, and the valve body 21 extends into the fixing sleeve 16 at the same time. That is, when the valve body 21 is inserted into the fixing sleeve 16, the sliding cylinder 12 is synchronously inserted into the second docking port 211, so that stability and reliability when the male module 10 and the female module 20 are docked with each other can be effectively improved.

It may be understood that, in another implementation, when the male module 10 and the female module 20 are not docked with each other, the right end of the sliding cylinder 12 may slightly extend from the right end of the fixing sleeve 16, or the right end of the sliding cylinder 12 may be located inside the fixing sleeve 16. This is not limited in this application.

In addition, when the male module 10 and the female module 20 are docked with each other, to prevent the male module 10 and the female module 20 from being separated and keep a state of communicating with each other, a connection structure may be further disposed in the male module 10 and the female module 20.

Figure 22:
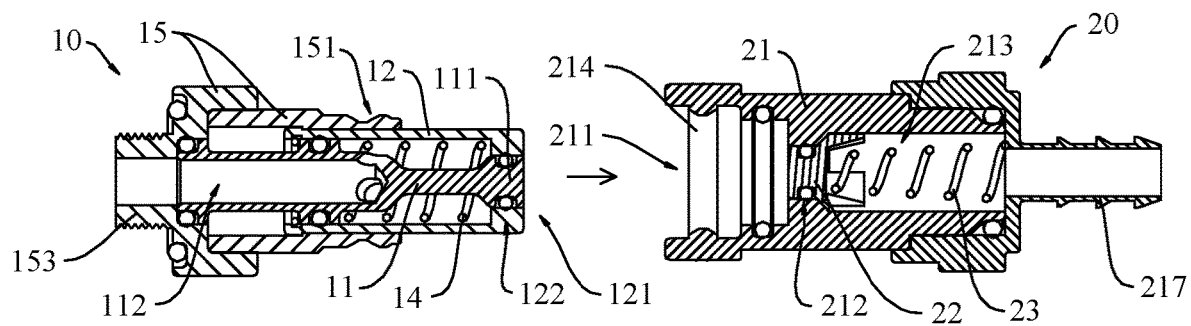
FIG. 22 is a schematic diagram of a cross-sectional structure of still another joint according to an embodiment of this application.

As shown in FIG. 22, in an embodiment provided in this application, the male module 10 may further include a seat body 15, and the seat body 15 is fixedly connected to the core rod 11. The seat body 15 is provided with a first connecting portion capable of connecting to the valve body 21, the valve body 21 is provided with a second connecting portion capable of connecting to the first connecting portion, and after the first docking port 121 and the second docking port 211 are docked hermetically, the first connecting portion and the second connecting portion are connected, so that the core rod 11 tightly abuts the piston 22, and the male module 10 and the female module 20 are kept in a state of communicating with each other. Certainly, to ensure that an external pipe can be docked with the male module 10, a first connecting nozzle 153 is disposed on the seat body 15. A left end of the first connecting nozzle 153 may be provided with a thread structure, to facilitate connection to the external pipe. A right end of the first connecting nozzle 153 communicates with the second channel 112 of the core rod 11. Correspondingly, a second connecting nozzle 217 is disposed on the valve body 21 of the female module 20. A right end of the second connecting nozzle 217 may be provided with a corrugated structure, to facilitate connection to an external pipe. A left end of the second connecting nozzle 217 communicates with the first channel 213 of the valve body 21.

During specific implementation, a connection manner between the first connecting portion and the second connecting portion is any one of clamping, threaded connection, welding, and bonding. Certainly, the male module 10 and the female module 20 may alternatively be connected to each other in another connection manner.

For example, as shown in FIG. 22, in an embodiment provided in this application, the seat body 15 is provided with a hook 151, and the valve body 21 is provided with a flange 214 elastically engaged with the hook 151. After the first docking port 121 and the second docking port 211 are docked, the hook 151 on the seat body 15 and the flange 214 on the valve body 21 are engaged with each other, so that the male module 10 and the female module 20 are connected, and the male module 10 and the female module 20 are prevented from being separated, and can be kept in a state of communicating with each other.

Figure 23:
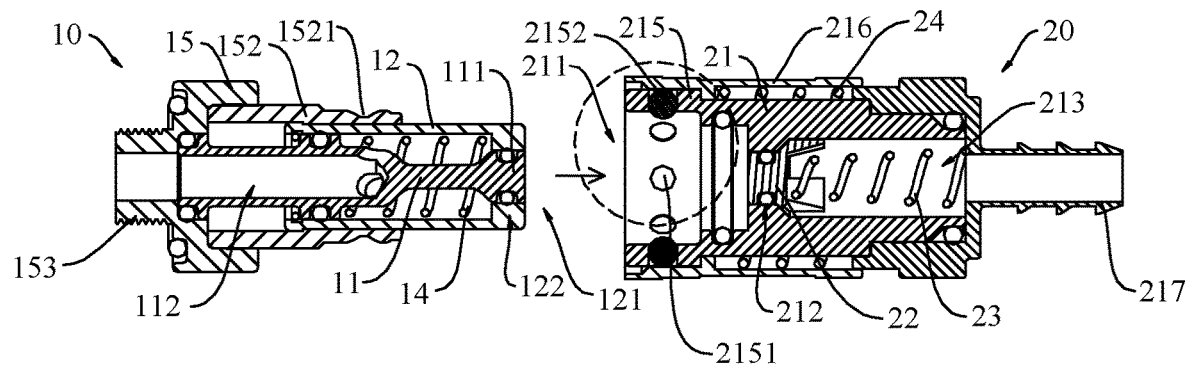
FIG. 23 is a schematic diagram of a cross-sectional structure of another joint according to an embodiment of this application.
Figure 24:
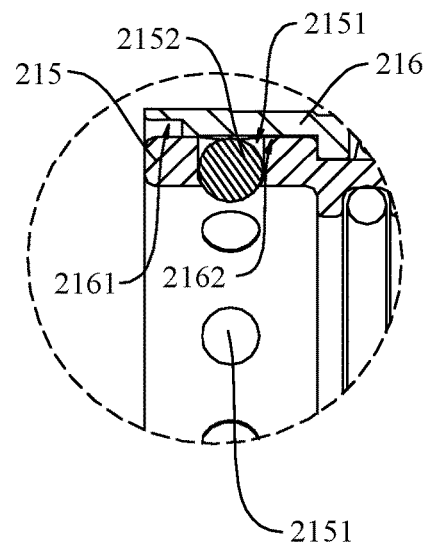
FIG. 24 is a partial enlarged view of FIG. 23.

In addition, as shown in FIG. 23 and FIG. 24, in another embodiment provided in this application, the seat body 15 is provided with a first connecting ring 152, and a clamping groove 1521 is disposed on an outer periphery of the first connecting ring 152. The valve body 21 is provided with a second connecting ring 215 and a stopping ring 216 slidably sleeved on an outer periphery of the second connecting ring 215. The second connecting ring 215 is provided with a bead hole 2151 penetrating an inner wall and an outer wall of the second connecting ring, and a clamp bead 2152 is disposed in the bead hole 2151. A diameter of an inner port (a port located on the inner wall of the second connecting ring 215) of the bead hole 2151 is less than a diameter of the clamp bead 2152, to prevent the clamp bead 2152 from rolling out from the inner port. A diameter of an outer port (a port located on the outer wall of second connecting ring 215) of the bead hole 2151 is not less than the diameter of the clamp bead 2152, so that the clamp bead 2152 can be conveniently put into the bead hole 2151 during assembly, and the clamp bead 2152 can be allowed to roll out from the outer port. An inner wall of the stopping ring 216 is provided with a first stopping surface 2161 and a second stopping surface 2162. The first connecting ring 152 is inserted into the second connecting ring 215. When the first stopping surface 2161 slides to the outer port, the first stopping surface 2161 pushes the clamp bead 2152 to be clamped in the clamping groove 1521. When the second stopping surface 2162 slides to the outer port, the clamp bead 2152 can be separated from the clamping groove 1521, and a distance between the second stopping surface 2162 and the outer port is less than the diameter of the clamp bead 2152.

Further, the clamp bead 2152 may roll freely in the bead hole 2151. When the clamp bead 2152 rolls to the inner port, a part of the clamp bead extends into the second connecting ring 215, and the extended part may be clamped in the clamping groove 1521 of the first connecting ring 152. Certainly, to keep such a clamped state, the first stopping surface 2161 of the stopping ring 216 may be slid to the outer port of the bead hole 2151 to prevent the clamp bead 2152 from rolling in a direction towards the outer port, so that the clamp bead 2152 and the clamping groove 1521 are kept in a clamping relationship, and the male module 10 and the female module 20 are connected. When the male module 10 and the female module 20 need to be separated, the second stopping surface 2162 of the stopping ring 216 may be slid to the outer port of the bead hole 2151. Because the distance between the second stopping surface 2162 and the outer port is greater than a distance between the first stopping surface 2161 and the outer port, the clamp bead 2152 may be allowed to roll in the direction towards the outer port, and the clamp bead 2152 may be disengaged from the clamping groove 1521. In addition, to prevent the clamp bead 2152 from completely rolling out from the outer port and falling, the distance between the second stopping surface 2162 and the outer port needs to be less than the diameter of the clamp bead 2152.

During specific implementation, one bead hole 2151 may be disposed, or a plurality of bead holes may be annularly arrayed along a ring wall of the second connecting ring 215. Certainly, the bead hole 2151 may be disposed perpendicularly to the ring wall, or may be disposed at a specific inclination angle.

In addition, because the stopping ring 216 may slide freely relative to the second connecting ring 215, after the male module 10 and the female module 20 are docked, to ensure that the clamp bead 2152 is kept clamped in the clamping groove 1521, in an embodiment provided in this application, the female module 20 further includes a third tightening spring 24. The third tightening spring 24 acts on the stopping ring 216 and the second connecting ring 215 or the valve body 21, and is configured to drive the first stopping surface 2161 of the stopping ring 216 to slide to the outer port of the bead hole 2151, so that the first stopping surface 2161 functions to limit the clamp bead 2152, to prevent the clamp bead 2152 from being disengaged from the clamping groove 1521.

Further, before the male module 10 and the female module 20 are docked, as the third tightening spring 24 acts on the stopping ring 216, the stopping surface 2161 is located at the outer port of the bead hole 2151. When the male module 10 and the female module 20 need to be docked, the user may act on the stopping ring 216 to slide the stopping ring 216 to the right to compress the third tightening spring 24, so that the second stopping surface 2162 is located at the outer port. In this case, the first connecting ring 152 is inserted into the second connecting ring 215. In an insertion process, a ring wall of the first connecting ring 152 pushes the clamp bead 2152 to roll to the outer port. When the clamping groove 1521 is located at the inner port, the user may release the acting force on the stopping ring 216. Under an elastic force of the third tightening spring 24, the stopping ring 216 slides to the left, so that the first stopping surface 2161 is located at the outer port, and the first stopping surface 2161 pushes the clamp bead 2152 to roll to the inner port, so that the clamp bead 2152 is clamped in the clamping groove 1521.

Certainly, for the interfaces shown in the foregoing embodiments, based on different application scenarios, different structure types may be selected for use.

Figure 25:
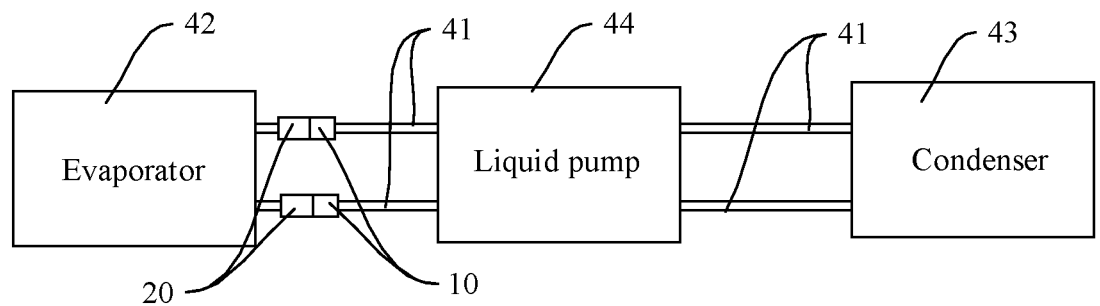
FIG. 25 is a schematic structural diagram of a cooling system according to an embodiment of this application.

As shown in FIG. 25, a cooling system provided in this application includes a function device and a cooling pipe, and further includes the joint in any one of the foregoing embodiments. The function device communicates with the cooling pipe through the joint.

Further, the function device may include an evaporator 42, a condenser 43, a liquid pump 44, and the like, and a medium in the cooling pipe 41 may be gas, liquid, or the like.

For example, as shown in FIG. 25, a cooling system provided in this application includes an evaporator 42, a condenser 43, and a liquid pump 44 that communicate with each other through a cooling pipe 41. The evaporator 42 is used as an example. To implement rapid docking between the evaporator 42 and the pipe 41, a female module 20 is installed on one side of the cooling pipe 41 that is connected to the evaporator 42, and a male module 10 is installed on the other side of the cooling pipe 41 that is connected to the liquid pump 44. The evaporator 42 and the liquid pump 44 communicate with each other by docking the male module 10 and the female module 20. During actual use, the male module 10 and the female module 20 may be docked, and the male module 10 and the female module 20 may be fixedly connected through clamping, threaded connection, welding, bonding, and the like described in the foregoing embodiments. It may be understood that, during specific implementation, positions of the female module 20 on the side of the cooling pipe 41 that is connected to the evaporator 42 and the male module 10 on the side of the cooling pipe 41 that is connected to the liquid pump 44 may be interchanged. In addition, the liquid pump 44 and the condenser 43 may also be connected by disposing the joint in any one of the foregoing embodiments (that is, docking the male module 10 and the female module 20).

Certainly, during specific implementation, the cooling system may be applied to different devices based on different requirements. For example, the cooling system may be applied to a desktop computer, a notebook computer, a tablet computer, or a server.

Figure 26:
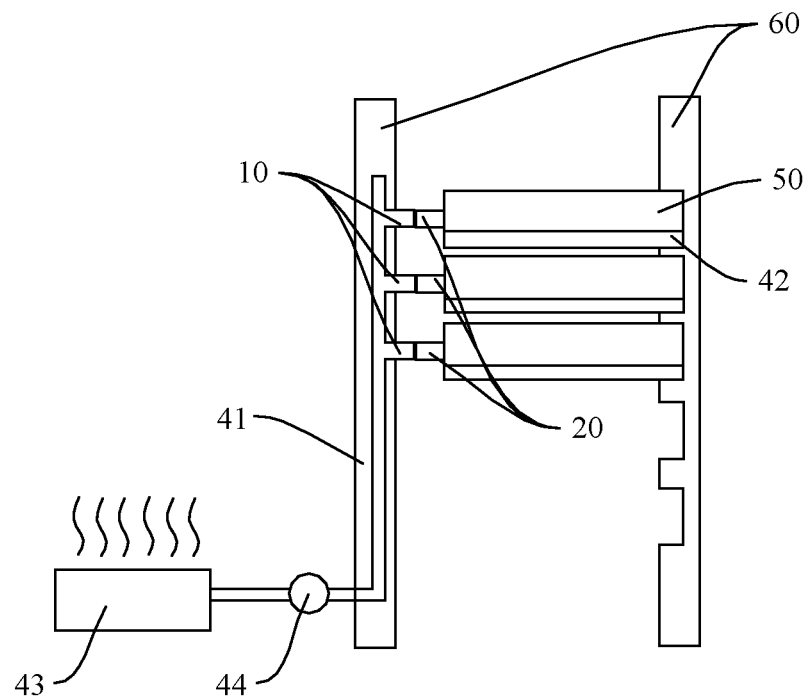
FIG. 26 is a schematic structural diagram of a computer apparatus according to an embodiment of this application.

For example, as shown in FIG. 26, an embodiment of this application provides a computer apparatus, including an electronic component and the foregoing cooling system. The electronic component may be a processor, a memory, or the like.

Further, as shown in FIG. 26, in an embodiment provided in this application, the computer apparatus may be a server 50. Because a large amount of heat is generated during running of the server 50, to cool the server 50 to ensure normal running of the server, the evaporator 42 is disposed close to the server, or the server 50 and the evaporator 42 are fixed as a whole.

During specific implementation, the server 50 may be installed on a bracket 60. In some specific implementations, the female module 20 may be fixed on a housing of the evaporator 42 or a housing of the server 50, and the male module 10 may be fixed on the bracket 60. When the evaporator 42 or the server 50 is installed at an installation position on the bracket 60, the male module 10 and the female module 20 may be docked at the same time. Certainly, in some specific implementations, to ensure that the server 50 or the evaporator 42 is stably installed on the bracket 60, the housing of the server 50 or the housing of the evaporator 42 may be fixedly connected to the bracket 60 by using a component such as a bolt. Therefore, in some implementations, the male module 10 and the female module 20 may omit structures for connection to each other. Further, the male module 10 may not be provided with a related component such as the hook 151 or the first connecting ring 152, and the female module 20 may not be provided with a component such as the flange 214 or the second connecting ring 215, to reduce manufacturing and use costs.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:
1. A joint comprising:
   a male module comprising:
      a core rod comprising:
         a first outer periphery; and
         a piston head; and
      a sliding cylinder slidably sleeved on the first outer periphery and comprising:

a first valve port that is disposed on an interior surface of the sliding cylinder and is hermetically fit with the piston head; and
a first end comprising a first docking port; and
a first tightening spring coupled to the core rod and the sliding cylinder; and
a female module configured to dock with the male module and comprising:
a valve body comprising:
a first channel disposed in the valve body;
a second valve port disposed in the first channel; and
a second docking port configured to communicate with the first channel; and
a piston slidably disposed in the first channel and further hermetically fit with the second valve port,
wherein after hermetically docking the first docking port and the second docking port:
the core rod is configured to slide in a first direction extending from the first docking port; and
the piston head is configured to:
separate from the first valve port;
slide in a first direction of retracting into the second docking port when the core rod is sliding; and
separate from the second valve port, wherein the first tightening spring is configured to drive the core rod to slide in a second direction of retracting into the first docking port to enable the piston head to hermetically contact with the first valve port.

2. The joint of claim 1, wherein the female module further comprises a second tightening spring coupled to the piston and the valve body and configured to drive the piston to slide in a second direction extending from the second docking port to enable the piston to hermetically contact with the second valve port.

3. The joint based on claim 1, further comprising:
a clearance configured to communicate with the first valve port and disposed between the core rod and the sliding cylinder, wherein a sealing part is disposed in the clearance, and wherein the sealing part is configured to slide to hermetically contact with an outer wall of the core rod and an inner wall of the sliding cylinder;
a second channel configured to communicate outside the joint and disposed in the core rod; and
an opening configured to communicate with the second channel and the clearance and disposed in the core rod, wherein the opening is located between the sealing part and the piston head.

4. The joint of claim 1, wherein the male module further comprises a seat body that is fixedly coupled to the core rod, wherein the seat body comprises a first connecting portion configured to couple to the valve body, wherein the valve body comprises a second connecting portion configured to couple to the first connecting portion, and wherein the first connecting portion and the second connecting portion are coupled to enable the core rod to abut the piston after hermetically docking the first docking port and the second docking port.

5. The joint of claim 4, wherein the seat body further comprises a first connecting ring, wherein the first connecting ring comprises a second outer periphery, wherein a clamping groove is disposed on the second outer periphery, wherein the valve body further comprises:
a second connecting ring comprising:
a third outer periphery; and
a bead hole penetrating an inner wall of the second connecting ring and an outer wall of the second connecting ring, wherein a clamp bead is disposed in the bead hole, wherein a first diameter of an inner port of the bead hole is less than a second diameter of the clamp bead, and wherein a third diameter of an outer port of the bead hole is not less than the second diameter,
wherein the first connecting ring is inserted into the second connecting ring; and
a stopping ring slidably sleeved on the third outer periphery, wherein an inner wall of the stopping ring comprises:
a first stopping surface configured to push the clamp bead to be clamped in the clamping groove when the first stopping surface slides to the outer port; and
a second stopping surface, wherein the clamp bead is configured to separate from the clamping groove when the second stopping surface slides to the outer port, and wherein a distance between the second stopping surface and the outer port is less than the second diameter.

6. The joint of claim 5, wherein the female module further comprises a third tightening spring coupled to the stopping ring and the second connecting ring and configured to drive the first stopping surface to slide to the outer port.

7. The joint of claim 1, wherein the male module further comprises a fixing sleeve fixedly coupled to the core rod and is sleeved on a fourth outer periphery of the sliding cylinder, and wherein a part of the valve body is sleeved in the fixing sleeve.

8. The joint of claim 7, wherein the fixing sleeve is in a clearance fit with the valve body.

9. The joint of claim 1, wherein the male module further comprises a first connecting nozzle for docking with a pipe, and wherein the first connecting nozzle is coupled with the first docking port through the first valve port.

10. The joint of claim 1, wherein the female module further comprises a second connecting nozzle for docking with a pipe, and wherein the second connecting nozzle is coupled with the second docking port through the second valve port.

11. A cooling system comprising:
a function device;
a cooling pipe; and
a joint configured to provide communication between the function device and the cooling pipe and comprising:
a male module comprising:
a core rod comprising:
a first outer periphery; and
a piston head; and
a sliding cylinder slidably sleeved on the first outer periphery and comprising:
a first valve port that is disposed on an interior surface of the sliding cylinder and hermetically fits with the piston head; and
a first end comprising a first docking port; and
a first tightening spring coupled to the core rod and the sliding cylinder; and
a female module configured to dock with the male module and comprising:
a valve body comprising:
a first channel disposed in the valve body, wherein a second valve port is disposed in the first channel; and
a second docking port that communicates with the first channel; and
a piston slidably disposed in the first channel and further hermetically fits with the second valve port, wherein after hermetically docking the first docking port and the second docking port:
the core rod is configured to slide in a first direction of extending from the first docking port; and
the piston head is configured to:
separate from the first valve port;
slide in a first direction of retracting into the second docking port when the core rod is sliding; and
separate from the second valve port, wherein the first tightening spring is configured to drive the core rod to slide in a second direction of retracting into the first docking port to enable the piston head to hermetically contact with the first valve port.

12. The cooling system of claim 11, wherein the female module further comprises a second tightening spring coupled to the piston and the valve body and configured to drive the piston to slide in a second direction of extending from the second docking port to enable the piston to hermetically contact with the second valve port.

13. The cooling system of claim 11, wherein the joint further comprises:
a clearance that communicates with the first valve port is disposed between the core rod and the sliding cylinder, wherein a sealing part is disposed in the clearance, and wherein the sealing part is configured to slide to hermetically contact with an outer wall of the core rod and an inner wall of the sliding cylinder;
a second channel that communicates with outside is disposed in the core rod; and
an opening that communicates with the second channel and the clearance is disposed in the core rod, wherein the opening is located between the sealing part and the piston head.

14. The cooling system of claim 11, wherein the male module further comprises a seat body that is fixedly coupled to the core rod, wherein the seat body comprises a first connecting portion configured to couple to the valve body, wherein the valve body comprises a second connecting portion configured to couple to the first connecting portion, and wherein the first connecting portion and the second connecting portion are coupled to enable the core rod to tightly abut the piston after hermetically docking the first docking port and the second docking port.

15. The cooling system of claim 14, wherein the seat body further comprises a first connecting ring, wherein the first connecting ring comprises a second outer periphery, wherein a clamping groove is disposed on the second outer periphery, wherein the valve body further comprises:
a second connecting ring comprising:
a third outer periphery; and
a bead hole penetrating an inner wall of the second connecting ring and an outer wall of the second connecting ring, wherein a clamp bead is disposed in the bead hole, wherein a first diameter of an inner port of the bead hole is less than a second diameter of the clamp bead, and wherein a third diameter of an outer port of the bead hole is not less than the second diameter,
wherein the first connecting ring is inserted into the second connecting ring; and
a stopping ring slidably sleeved on the third outer periphery, wherein an inner wall of the stopping ring comprises:
a first stopping surface configured to push the clamp bead to be clamped in the clamping groove when the first stopping surface slides to the outer port; and
a second stopping surface, wherein the clamp bead is configured to separate from the clamping groove when the second stopping surface slides to the outer port, and wherein a distance between the second stopping surface and the outer port is less than the second diameter.

16. The cooling system of claim 15, wherein the female module further comprises a third tightening spring coupled to the stopping ring and the second connecting ring and configured to drive the first stopping surface to slide to the outer port.

17. The cooling system of claim 11, wherein the male module further comprises a fixing sleeve fixedly coupled to the core rod and is sleeved on a fourth outer periphery of the sliding cylinder, and wherein a part of the valve body is sleeved in the fixing sleeve.

18. A computer apparatus comprising:
an electronic component; and
a cooling system coupled to the electronic component and comprising:
a function device;
a cooling pipe; and
a joint, wherein the function device communicates with the cooling pipe through the joint, wherein the joint comprises:
a male module comprising:
a core rod comprising:
a first outer periphery; and
a piston head; and
a sliding cylinder slidably sleeved on the first outer periphery and comprising:
a first valve port that is disposed on an interior surface of the sliding cylinder and hermetically fits with the piston head; and
a first end comprising a first docking port; and
a first tightening spring coupled to the core rod and the sliding cylinder; and
a female module configured to dock with the male module and comprising:
a valve body comprising:
a first channel disposed in the valve body, wherein a second valve port is disposed in the first channel; and
a second docking port that communicates with the first channel; and
a piston slidably disposed in the first channel and further hermetically fits with the second valve port,
wherein after hermetically docking the first docking port and the second docking port:
the core rod is configured to slide in a first direction of extending from the first docking port; and
the piston head is configured to:
separate from the first valve port;
slide in a first direction of retracting into the second docking port when the core rod is sliding; and
separate from the second valve port, wherein the first tightening spring is configured to drive the core rod to slide in a second direction of retracting into the first docking port to enable the piston head to hermetically contact with the first valve port.

19. The computer apparatus of claim 18, wherein the female module further comprises a second tightening spring coupled to the piston and the valve body and configured to drive the piston to slide in a second direction of extending from the second docking port to enable the piston to hermetically contact with the second valve port.

20. The computer apparatus of claim 18, wherein the joint further comprises:
- a clearance that communicates with the first valve port is disposed between the core rod and the sliding cylinder, wherein a sealing part is disposed in the clearance, and wherein the sealing part is configured to slide to hermetically contact with an outer wall of the core rod and an inner wall of the sliding cylinder;
- a second channel that communicates with outside is disposed in the core rod; and
- an opening that communicates with the second channel and the clearance is disposed in the core rod, wherein the opening is located between the sealing part and the piston head.

* * * * *

UNITED STATES PATENT AND TRADEMARK OFFICE
CERTIFICATE OF CORRECTION

| | | |
|---|---|---|
| PATENT NO. | : 12,253,199 B2 | Page 1 of 1 |
| APPLICATION NO. | : 17/576284 | |
| DATED | : March 18, 2025 | |
| INVENTOR(S) | : Xinhu Gong, Haofeng Chen and Gaoliang Xia | |

It is certified that error appears in the above-identified patent and that said Letters Patent is hereby corrected as shown below:

On the Title Page

Item (56) Foreign Patent Documents: "CN 2016161066 A 9/2016" should read "JP 2016161066 A 9/2016"

Signed and Sealed this
Sixth Day of May, 2025

Coke Morgan Stewart
*Acting Director of the United States Patent and Trademark Office*